(12) United States Patent
Kaesser

(10) Patent No.: US 10,468,734 B2
(45) Date of Patent: Nov. 5, 2019

(54) RESONATOR AND FILTER WITH RESONATOR

(71) Applicant: Tesat-Spacecom GmbH & Co. KG, Backnang (DE)

(72) Inventor: Tobias Kaesser, Stuttgart (DE)

(73) Assignee: Tesat-Spacecom GmbH & Co. KG (DE)

( * ) Notice: Subject to any disclaimer, the term of this patent is extended or adjusted under 35 U.S.C. 154(b) by 129 days.

(21) Appl. No.: 15/496,205

(22) Filed: Apr. 25, 2017

(65) Prior Publication Data

US 2017/0317662 A1 Nov. 2, 2017

(30) Foreign Application Priority Data

Apr. 28, 2016 (DE) .................. 10 2016 107 955

(51) Int. Cl.
| | |
|---|---|
| *H01P 1/207* | (2006.01) |
| *H01P 7/06* | (2006.01) |
| *H03H 3/007* | (2006.01) |
| *H03H 9/24* | (2006.01) |
| *H03H 9/46* | (2006.01) |

(52) U.S. Cl.
CPC ............. *H01P 1/207* (2013.01); *H01P 7/06* (2013.01); *H03H 3/007* (2013.01); *H03H 9/24* (2013.01); *H03H 9/46* (2013.01)

(58) Field of Classification Search
CPC . H03H 9/24; H03H 3/007; H03H 9/46; H01P 7/06
USPC ......................................................... 333/186
See application file for complete search history.

(56) References Cited

U.S. PATENT DOCUMENTS

| | | | |
|---|---|---|---|
| 3,701,058 A | 10/1972 | Smith | |
| 2011/0006861 A1 | 1/2011 | White et al. | |

FOREIGN PATENT DOCUMENTS

| | | |
|---|---|---|
| EP | 0 763 261 B1 | 8/2000 |
| KR | 2011 0012811 A | 2/2011 |
| WO | 2007/122409 A1 | 11/2007 |

OTHER PUBLICATIONS

Goelden et al., "Tunable Band-Pass Filter Based on Liquid Crystal", Proceedings of the German Microwave Conference 2010, pp. 98-101. (Year: 2010).*
Sep. 27, 2017 European Search Report EP 17168105.
Franke et al "Tunable Ka-band waveguide resonators and a small band band-pass filter based on liquid crystals," 2014 44th European Microwave Conference European Microwave Association, Oct. 6, 2014 (Oct. 6, 2014). pp. 339-342.
Follmann et al. "Liquida-Sky—A tunable liquid crystal filter for space applications," 2013 IEEE—APS Topical Conference on Antennas and Propagation in Wireless Communications (APWC). IEEE. Sep. 9, 2013 (Sep. 9, 2013), pp. 90-93.

(Continued)

*Primary Examiner* — Benny T Lee
*Assistant Examiner* — Hafizur Rahman
(74) *Attorney, Agent, or Firm* — Lerner, David, Littenberg, Krumholz & Mentlik, LLP

(57) ABSTRACT

A resonator, in particular a high-frequency resonator, includes a resonator housing with a resonator space formed therein and a container with a cavity in which a liquid crystal is accommodated, wherein the container is at least partially arranged in the resonator space and includes an electrode configuration for generating an electric control field for controlling the permittivity of the liquid crystal.

18 Claims, 3 Drawing Sheets

(56) References Cited

OTHER PUBLICATIONS

Jost et al. "Tuneable hollow waveguide devices for space applications based on liquid crystal," 2015 SBMO/IEEE MTT-S International Microwave and Optoelectronics Conference (IMOC). IEEE, Nov. 3, 2015 (Nov. 3, 2015). pp. 1-5.

Jost, Weickhmann, Strunck, Gabler, Fritzsch, Karabey & Jakoby, "Liquid crystal based low-loss phase shifter for W-band frequencies," Electronics Letters. vol. 49 No. 23, Nov. 7, 2013 (Nov. 7, 2013). pp. 1460-1462.

\* cited by examiner

RESONATOR AND FILTER WITH RESONATOR

FIELD OF THE INVENTION

The present description relates to a resonator, in particular to a high-frequency resonator, as well as a filter which comprises such a resonator.

BACKGROUND OF THE INVENTION

Resonators and filters are known which comprise a dielectric, the permittivity of which is adjustable for adjusting the resonance frequency in the resonator. Thereby, an electric control field is used for adjusting, which electric control field is generated by means of an electrode structure which is applied to an LTCC (Low temperature cofired ceramic) over resistor layers. The LTCC and, thus, the electrode structures are affixed or installed at surrounding walls or limiting walls of the cavity resonator.

BRIEF SUMMARY OF THE INVENTION

There may be a need to provide an improved resonator, in particular high-frequency resonator.

According to an aspect, a resonator, in particular a high-frequency resonator, is provided with a resonator housing comprising a resonator space formed therein, and a container or receptacle with a cavity in which a liquid crystal is accommodated, wherein the container is at least partially arranged in the resonator space and comprises an electrode configuration for generating an electric control field for controlling the permittivity of the liquid crystal.

To begin with, the resonator comprises a resonator housing and a container in which a liquid crystal is accommodated. Thereby, the liquid crystal is accommodated in a cavity of the container. The resonator housing comprises a resonator space and the container at least partially arranged within the resonator space. In other words, the container does not need to be entirely or completely arranged within the resonator space. Rather, it is sufficient if only a part of the container is arranged within the resonator space. Here, the container is especially arranged such that at least a part of the liquid crystal is located within the resonator space. Thus, the container forms a dielectric which influences the resonance frequency in the interior of the resonator.

For example, the resonator housing may comprise a bottom section or base section which is formed integrally with the side walls surrounding the resonator space so that the resonator housing at least partially is formed cup-shaped. The open end of this arrangement may be closed by a lid or cover which then forms a part of the resonator housing. The identified elements of the resonator housing may be made of the same material, for example a metal. The resonator housing may comprise threaded holes in which mounting screws may be screwed for mounting the lid.

The resonator space may comprise an inner wall, for example a cylindric inner wall, which delimits the resonator space at least in sections and which extends around or surrounds the resonator space. The inner wall may be interrupted by two aperture openings or there may be provided aperture openings in the inner wall.

Furthermore, the container comprises the electrode configuration for generating the electric control field. In the context of the description, this means that the container and the electrode configuration may form an assembly or a component. Here, the electrode configuration may be provided in a different manner at or in the container. The electrode configuration may be at least partially embedded in a material of the container. Furthermore, the electrode configuration may be provided at least partially at an outer circumference of the container, for example glued on.

According to a preferred embodiment, the container may be formed rod-shaped, for example, and be provided within the resonator housing such that the container protrudes from a wall of the resonator housing that delimits the resonator space into the resonator space. In particular, the container may protrude such into the resonator space that the liquid crystal located in the container is arranged at least partially in the resonator space, preferably in the middle of the resonator space. For example, the container may be shaped like a straight circular cylinder.

According to a further preferred embodiment, the cavity extends in longitudinal direction of the container. Here, the cavity may be provided substantially along the entire length of the container.

According to a preferred embodiment, the cavity is shaped like a circular cylinder. Hence, the container may be shaped like a hollow cylinder.

According to a further preferred embodiment, the electrode configuration comprises multiple control electrodes which extend along the container, in particular along the longitudinal direction of the container, which control electrodes are arranged around the cavity and around the longitudinal axis of the container. Preferably, the electrode configuration comprises four control electrodes. Furthermore, the control electrodes may be arranged in an equidistant manner.

Hence, the electrodes are arranged suitable as to be able to generate an electric field in the interior of the container. By electively positive or negative charge of the electrons it is possible to generate a directed field which influences the orientation of the liquid crystal, and to thereby influence its permittivity.

According to a preferred embodiment, the electrodes are arranged on an outer circumference of the container. For example, the electrodes may be printed onto the outer circumference of the container or may be provided in the form of wires and attached to the outer circumference of the container.

According to a further preferred embodiment, the electrodes are formed integrally within the container, preferably adjacent to or integrated into an inner wall of the container. In this manner, the electrodes may be provided as close as possible to the liquid crystal.

According to a further preferred embodiment, the container is made of a dielectric material.

According to a further preferred embodiment, the electrode configuration is designed such that signals in the resonator which may inject or couple into the electrode configuration are not lead out of the resonator housing.

According to a further preferred embodiment, the electrode configuration may comprise electrodes with a cross section that changes along the direction of extension of the electrodes. In this manner, changes in impedance are provided in the electrodes, which changes in impedance prevent transmission of a signal injected in the electrodes.

According to a preferred embodiment, the electrodes may comprise leading end sections having a direction of extension that differs from other sections of the electrodes. For example, the electrodes may first extend along an outer wall of the container, for example along the longitudinal direction of the container, and may then be bent in the leading end section, for example may be bent in a manner of a rightangle. Hence, the leading end sections may be arranged such that these are oriented in sections in a direction of another electrode and in sections side by side.

According to a preferred embodiment, the cavity of the container may be fluidically connected with a compensation device that is arranged outside the resonator housing, preferably in that the container spreads or extends through the resonator housing, wherein the compensation device may be a metallic bellow.

Hence, the container protrudes through the resonator housing. This may be required as for specific applications the liquid crystal is heated, which causes a volume expansion of the liquid crystal. In order to compensate for this volume expansion, a metallic bellow may be provided outside the resonator and at the end of the container, the interior space of which metallic bellow is connected with the cavity of the container. In case of applications with a constant operating temperature or if using a liquid crystal with low thermal expansion, such a compensation of the volume expansion may be omitted. However, it is also possible to provide a compensation opportunity within the resonator, for example by providing a container made of a highly flexible dielectric material. In this case, the container need not protrude through the resonator housing, but may be arranged within the resonator, for example at the inner wall or a recess in the inner wall. In this case, merely the electrodes provided at the container may be guided through the resonator housing.

According to another aspect, a filter is provided, preferably an Imux-filter, which comprises a multitude of the resonators described above.

According to another aspect, a method for manufacturing a resonator described above, in particular a high-frequency resonator, is provided. The method comprises the steps of providing a resonator housing with a resonator space, providing a container with a liquid crystal and an electrode configuration for generating an electric control field in order to control the permittivity of the liquid crystal, and inserting the container into the resonator housing in such a manner that a part of the container with the liquid crystal protrudes into the resonator space so that an electrically controllable dielectric is provided in the resonator space.

According to a preferred embodiment, the step of providing the container may comprise providing electrodes at the container.

According to a further preferred embodiment, provision of electrodes may comprise applying the electrodes at an outer circumference of the container. Thereby, the electrodes may be printed onto the outer circumference or may be integrated into the outer circumference, for example.

Furthermore, one or more adjusting screws or tuning screws may be provided in the lid and/or in the resonator housing, which adjusting screws protrude into the resonator space or into the aperture openings. These adjusting screws serve for changing the electromagnetic field for compensating fabrication tolerances. Mounting these adjusting screws at the lid is advantageous as they are better accessible thereby. Hence, one advantage is that, as a result of the described electrode structure, no electrodes are provided at the resonator housing, for example in the lid, whereby arranging the adjusting screws in this region is possible.

The resonator and filter described above may be designed for usage in high frequency range, for example for operation in Ka-Band.

DETAILED DESCRIPTION

Figure 1:
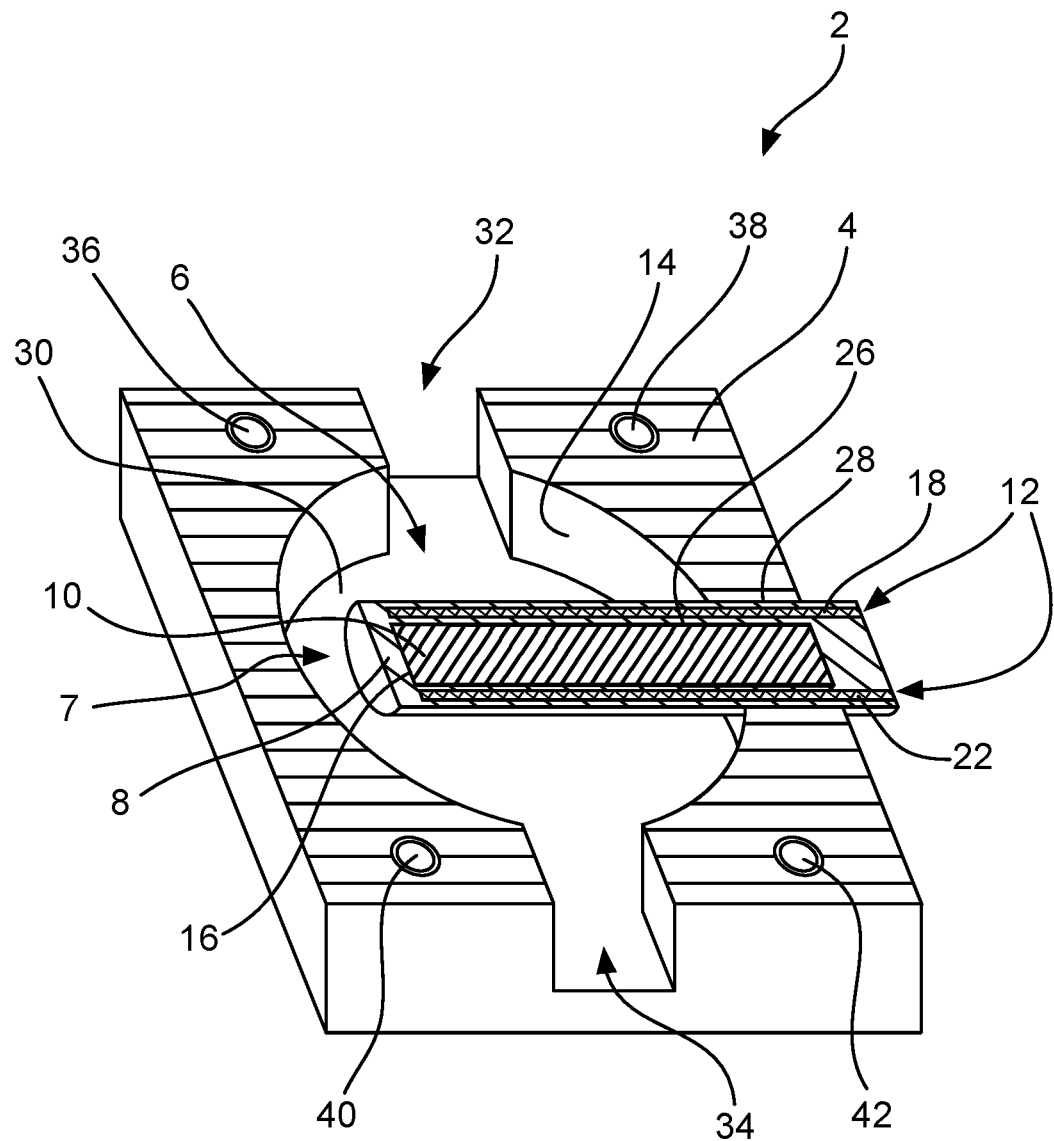
FIG. 1 shows a perspective sectional view of a resonator according to an exemplary embodiment.

In the following, an exemplary embodiment is described with reference to the drawings. Thereby, it is to be noted that identical or similar elements in the drawings are indicated with same reference signs.

FIG. 1 shows a perspective sectional view of a resonator 2 according to an exemplary embodiment. Here, the sectional view is chosen such that the resonator is cut more or less vertically and centrically. However, this representation is merely schematic and serves for explaining the embodiment of the resonator 2.

The resonator 2 shown in FIG. 1 comprises a resonator housing 4 which comprises a resonator space 6 in its interior, in which resonator space the resonance frequency shall be adjustable. In the shown exemplary embodiment, the resonator space 6 is delimited by a bottom surface 30 and is moreover designed such that the upper end of the resonator space 6 can be closed by a suitable lid (not shown). For this purpose, threaded holes 36, 38, 40, 42 are provided in the resonator housing 4, in which threaded holes mounting screws for affixing the lid to the resonator housing 4 may be accommodated. Furthermore, in this shown exemplary embodiment, the resonator space 6 is delimited by a cylindric inner wall 14 which extends around the resonator space 6 and which is interrupted merely by two apertures 32, 34. These two apertures 32, 34 qualify the resonator 2 according to the exemplary embodiment shown here for being used in a filter. However, in this context it is noted, that the general design of the resonator housing 4 is not limited to the design shown here. Depending on the field of application of the resonator, the resonator housing may also be provided without apertures 32 or 34 and in another shape. In other words, the resonator space does not need to be shaped substantially cylindrically, as shown in FIG. 1, for example.

In accordance with the present exemplary embodiment and in order to adjust the resonance frequency of the resonator 2, the resonator 2 comprises an electrically adjustable dielectric 7, which in the described case is provided in the shape of a container 8 in which a liquid crystal 10 is accommodated. In the shown exemplary embodiment, the container 8 is rod-shaped. In other words, the container 8 is shaped in a manner of a straight circular cylinder. Furthermore, the container 8 is made of a dielectric material.

As is shown in FIG. 1, the container 8 extends substantially in a horizontal direction and thereby especially in parallel to the bottom surface 30 of the resonator housing 4. Furthermore, the container 8 is arranged such that it is oriented substantially perpendicular with respect to the direction of extension of the two apertures 32, 34. Consequently, a longitudinal axis of the container 8 extends substantially perpendicular with respect to the direction of extension of both apertures 32, 34 and parallel to the bottom surface 30 of the resonator housing 4. Thereby, the longitudinal axis of the container 8 coincides with an axis of the circular cylinder. Here, it is to be noted that the container 8 need not be shaped completely like a circular cylinder. Rather, the container 8 may be shaped other than a circular cylinder, as shown in FIG. 1 on the right side, i.e., out of the resonator housing 4, for example. Also, the container 8 need not be shaped like a straight circular cylinder in the interior of the resonator housing 4, but may be in any possible form which ensures a function of the electrically adjustable dielectric 7.

In order to arrange the electrically adjustable dielectric 7 in the manner described above, the resonator housing 4 comprises an opening 28 in its inner wall 14, in which opening the electrically adjustable dielectric 7, in particular the container 8, is inserted and affixed such that the leading end of the electrically adjustable dielectric 7 protrudes from the inner wall 14 and into the interior space 6 of the resonator 2. Thereby, the opening 28 is of a form which is shaped to correspond to the form of the outer circumference of the electrically adjustable dielectric 7 or of the container 8. In the shown embodiment, the opening 28 is shaped like a circular cylinder, wherein the axis of extension of the opening 28 and the axis of extension of the container 8 are oriented in parallel to the bottom surface 30 and substantially perpendicular to the axes of extension of the apertures 32, 34. Furthermore, opening 28 is arranged at a predetermined distance from the bottom surface 30, whereby the container 8 is spaced apart from the bottom surface 30 in the arrangement shown in FIG. 1. Even though it is not shown in FIG. 1, opening 28 is arranged at a predetermined distance from an upper end of the inner wall 14 so that the electrically adjustable dielectric 7 or its container 8 are also arranged at a predetermined distance from the upper end of the resonator housing 4 and, hence, at a predetermined distance from a lid (not shown), which lid is used for closing the resonator housing 4. Summing up, the container 8 thus protrudes from the inner wall 14 into the resonator space 6 such that the part of the container 8 that is located within the resonator space 6 is spaced apart at least from the bottom surface 30 and the lid (not shown). However, apart from this recently described arrangement, also a different arrangement of the container within the resonator housing 4 may take place, as long as such arrangement enables adapting the resonance frequency in the interior of the resonator 2.

As is further shown in FIG. 1, the electrically controllable dielectric 7 comprises the liquid crystal 10 in addition to the already described container 8, which liquid crystal is accommodated in a cavity 26 of the container 8. The liquid crystal 10 is controllable by an electric control field. More precisely, the permittivity of the liquid crystal 10 may be influenced by applying an electric field. The cavity 26 of the container 8 is likewise shaped like a circular cylinder, more precisely such that the cylindric axes of the container 8 and of the cavity 26 coincide. Thus, the container 8 is at least shaped like a hollow cylinder.

In order to provide the electric control field mentioned above, the electrically controllable dielectric 7 comprises an electrode structure 12. The electrode structure 12 comprises a number of electrodes which are arranged such that they may generate a suitable electric field in the interior of the container 8. For this purpose, four electrodes 18, 20, 22, 24 are provided in the container 8, more precisely, around the cavity 26, in accordance with the present exemplary embodiment. Even though four electrodes are described with reference to the present exemplary embodiment, another suitable number of electrodes may be used alternatively in order to generate the electric control field.

In the sectional view of FIG. 1, the two electrodes 18 and 22 of the four electrodes are shown. The other two electrodes are schematically shown in the FIGS. 2a-2d. In the shown exemplary embodiment, the electrodes 18, 20, 22, 24 are arranged such that they extend in longitudinal direction of the container 8 and substantially in parallel to the inner wall of the container 8 or the wall of the container 8 that delimits the cavity 26. Furthermore, in the shown exemplary embodiment, all four electrodes are arranged at the same distance around the cavity 26 of the container 8. In other words, two electrodes are arranged opposite to each other, respectively, with respect to the cavity 26.

In the exemplary embodiment shown in FIG. 1, the electrodes are provided integrally in the container 8. More precisely, in the exemplary embodiment shown in FIG. 1, the electrodes 18, 20, 22, 24 are integrated in the container 8 such that these are completely surrounded by the material of the container 8 or embedded into the material of the container, respectively. Furthermore, in the shown exemplary embodiment, the electrodes are integrated into the container 8 in the form of conductive tracks. For example, these conductive tracks may comprise a wire or may also be at least partially printed onto the material of the container. Furthermore, it is not required to completely embed the conductive tracks or electrodes into the material of the container. Rather, it is also possible, for example, to provide the conductive tracks or electrodes at the outer circumference of the container 8 or to embed into the outer circumference of the container 8. It is also possible to provide the electrodes at the inner wall of the container 8 or to integrate the electrode therein. The electrodes are guided outside through the wall of the resonator housing 4. More precisely, the electrodes are accessible from outside at the rear end of the container 8, in FIG. 1 on the right side of the container 8 and may, hence, be connected with a control circuit in an appropriate manner.

Even though this is not shown in FIG. 1, measures may be provided such that a signal which may inject into those parts of the electrodes that are located in the interior of the resonator housing 4 cannot be lead outside. For example, the electrode cross section dimensions may vary along their length, whereby change in impedance are provided in the electrodes. This may be designed such that a signal in the range of the operation frequency of the resonator is not transmitted via the electrodes. Alternatively or additionally, it is possible to capacitively connect the electrodes with ground, for example at the resonator boundary, in particular the resonator housing, such that those parts of the electrodes that are located within the resonator space are non-resonant at predetermined frequencies. However, these two options are merely exemplary and various other alternatives are possible which prevent leading away a signal via the electrodes.

An advantage of the arrangement lies in the fact that the electrodes are firmly connected with the container 8 and, hence, an integral assembly is provided which may be manufactured as a distinct element and be installed in the resonator housing. In this manner, no distinct mounting steps for providing the electrodes are required. Hence, the container 8 including the liquid crystal 10 and the electrodes may be inserted into the resonator housing 4 through a corresponding opening.

Figure 2A:
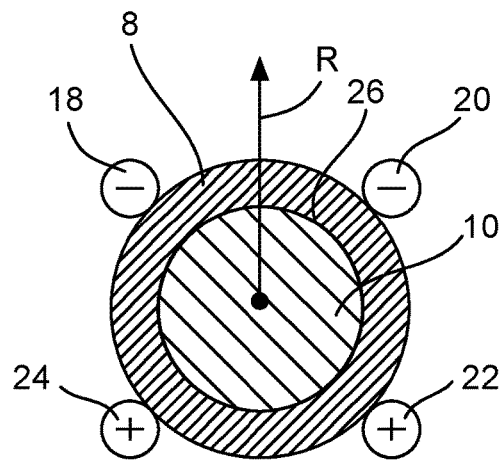
FIGS. 2*a*-2*d* show cross sectional views of the container and possible orientations of the electric control field according to an exemplary embodiment.
Figure 2B:
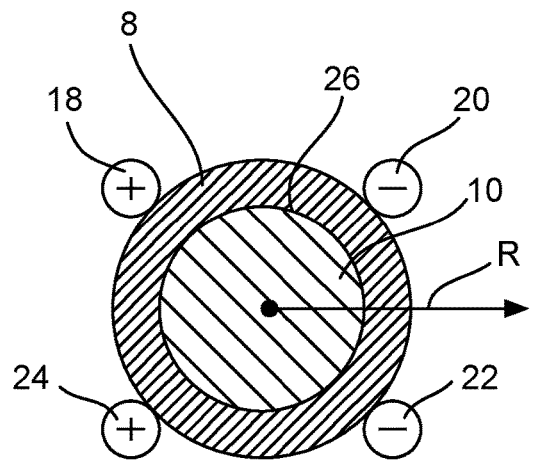
Figure 2C:
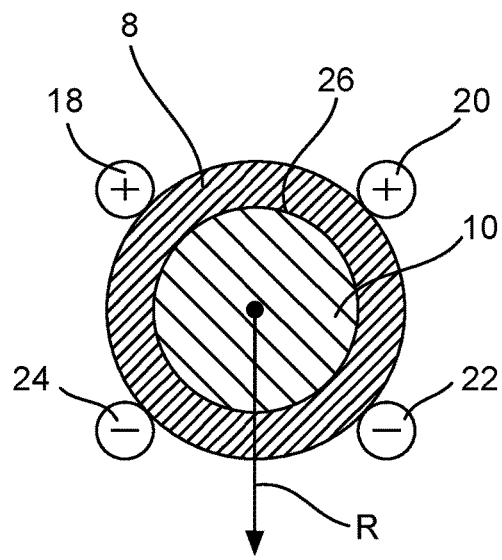
Figure 2D:
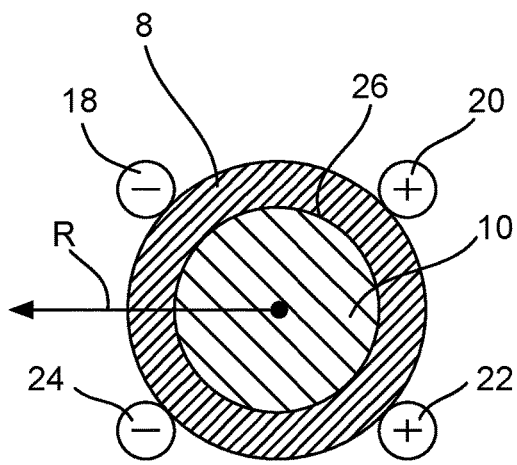

FIG. 2a-2d schematically and exemplarily show generation of electric control fields. The container 8 is shown in cross section and the direction of the control field generated in the center of the container 8 is indicated by an arrow R. The charge of the individual electrodes 18, 20, 22, 24 is likewise shown. In FIG. 2a, the two electrodes 18 and 20 are negatively charged and the two electrodes 22 and 24, which are arranged in FIG. 2a at the bottom, are positively charged. In case of voltages having the same absolute value, a resulting electric field in the center of the container 8 is established, which in FIG. 2a shows to the top, as indicated by arrow R. In case of correspondingly changing the charge of the electrodes with voltages of the same absolute value in all electrodes, the resulting electric fields may be generated in a similar manner as shown in FIGS. 2b-2d. Hence, in case of voltages having the same absolute value at the electrodes, resulting electric fields may be generated in four directions. By applying voltages of unequal absolute values at the electrodes, any desired orientations of the electric field in the center of the container may be generated. In this manner, the permittivity of the liquid crystal 10 and, hence, of the dielectric 7 may be adjusted by generating corresponding electric fields.

Figure 3A:
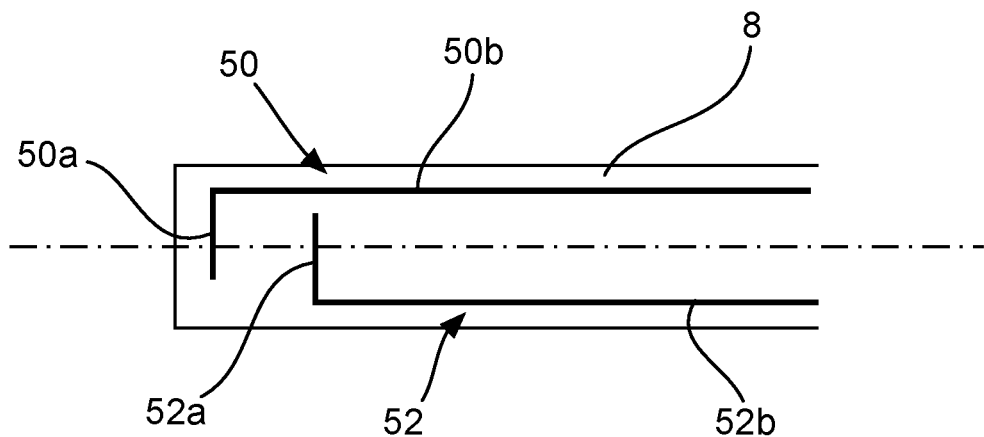
FIGS. 3*a* and 3*b* show an alternative electrode configuration according to an exemplary embodiment.
Figure 3B:
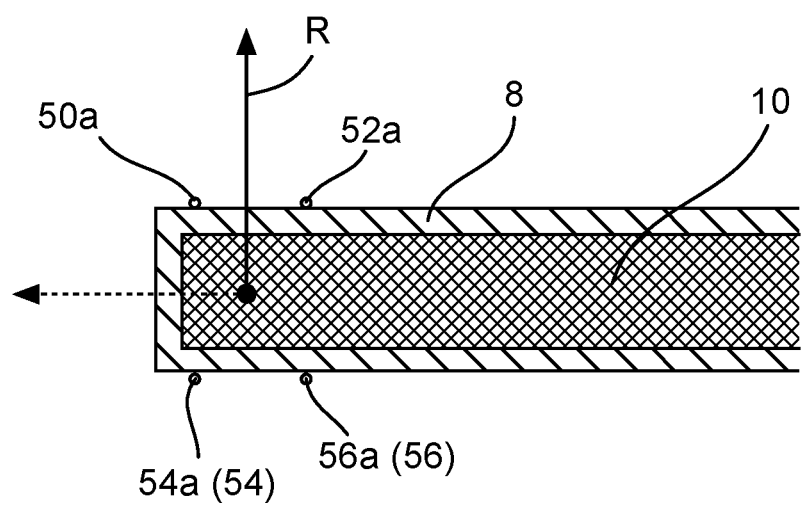

FIGS. 3a and 3b show an alternative electrode structure with electrodes 50, 52, 54, 56 which comprise leading end sections 50a, 52a, 54a, 56a, the direction of extension of which differs from other sections 50b, 52b, 54b, 56b of the electrodes 50, 52, 54, 56. In this shown exemplary embodiment, the electrodes 50, 52, 54, 56 initially extend along an outer wall of the container 8 and are then substantially rectangularly bent at their leading end section, as is shown in FIG. 3a. In other words, the leading end sections 50a, 52a extend substantially perpendicular with respect to the sections 50b and 52b. FIG. 3a is a view from top onto the container 8 and the electrode structure attached thereto. The leading end sections 50b, 52b, 54b, 56b are arranged such that these extend substantially parallel with respect to each other and overlap each other or are arranged side by side, wherein these are oriented in a direction towards the other electrode, respectively.

FIG. 3b shows a sectional view along a plane that is indicated in FIG. 3a in a dot dashed manner. As follows from FIG. 3b, the electrodes are arranged in this manner so that these enable generating an electric control field. More precisely, an analogue configuration as is shown in FIGS. 2a-2d results with respect to positive and negative charge, with the difference that the control field is not generated in a plane perpendicular with respect to the container, but in a plane which extends along the container. In this manner, at least in an overlap area of the leading end sections, a control field may be generated which is oriented differently. Depending on the design of the container or the resonator, such an arrangement may be advantageous.

In the exemplary embodiment shown in FIG. 1, the container 8 protrudes through the surrounding wall. This may be necessary as for specific use cases heating of the liquid crystal takes place which causes a volume expansion of the liquid crystal. In order to compensate this volume expansion, a metallic bellow may be provided outside the resonator and at the end of the container 8, in FIG. 1 at the right end of the container 8, wherein an interior space of the bellow may be connected with the cavity of the container 8. For applications having a constant operating temperature or in case of using a liquid crystal with low thermal expansion, such a compensation of the volume expansion may be omitted. However, a compensation within the resonator may also be possible, for example by providing a container made of a highly flexible dielectric material. In this case, the container need not protrude through the resonator, but may be arranged within the resonator. In this case, merely the electrodes must be guided through the resonator housing.

In total, an improved electrically controllable dielectric and an improved resonator are thus provided, which resonator is particularly suitable for high-frequency applications in outer space. For example, the here provided resonator may be used as high-frequency resonator in an Imux-filter. An electric control field may be generated in the interior of the resonator in the described manner. Thereby, the direction dependency of the dielectric constant of the liquid crystal may be utilized as to control, for example, the center frequency of a high-frequency resonator or of a high-frequency filter consisting of such resonators.

With the structure according to the description, a resonator or a filter with such resonators is provided having significantly improved high-frequency characteristics which have significantly lower high-frequency losses and, hence, also a lower variation of the insertion loss within the filter passband. Furthermore, manufacturing and mounting is improved as, for example, mounting of an electrode configuration on inner walls of the resonator housing is omitted, wherein the electrode configuration is provided, for example, in the form of an electrode structure applied over resistance layers on LTCC. In accordance with the description, the electrode configuration required for generating the electric control field is applied directly onto the container of the dielectric, in which container the liquid crystal is inserted within the cavity resonator. Thus, usage of LTCC structures at the bottom and the lid of the cavity resonator may be omitted. For example, this enables manufacturing the bottom and a lateral surrounding wall of the cavity resonator of an integral piece. Furthermore, the elements that delimit the resonator space may be made of metal so that these may be simply mounted together, for example screwed together. Thereby, typical adjusting screws may be provided at the resonator housing and at the lid in addition to mounting screws. More precisely, one or more adjusting screws may be provided in the lid and/or in the resonator housing, which adjusting screws protrude into the resonator space or into aperture openings. These adjusting screws serve for changing the electromagnetic field for compensating fabrication tolerances. Mounting these adjusting screws at the lid is advantageous as they are better accessible thereby. Hence, one advantage is that as a result of the electrode structure, no electrodes are provided at the resonator housing, for example in the lid, whereby arranging the adjusting screws in this region is possible.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A resonator comprising:
   a resonator housing, in which a resonator space is formed;
   a container with a cavity, in which a liquid crystal is accommodated, wherein the container is at least partially arranged in the resonator space,
   wherein the container comprises an electrode configuration for generating an electric control field in order to control the permittivity of the liquid crystal, and
   wherein the electrode configuration comprises a plurality of control electrodes extending along a longitudinal axis of the container, the plurality of control electrodes arranged around the cavity and around the longitudinal axis of the container.

2. The resonator of claim 1, wherein the container is formed in a rod-shaped manner and is provided in the resonator housing such that the container protrudes into the resonator space from a wall of the resonator housing, which wall delimits the resonator space.

3. The resonator of claim 2, wherein the cavity extends along the longitudinal axis of the container.

4. The resonator of claim 1, wherein the cavity has a shape of a circular cylinder.

5. The resonator of claim 1, wherein the electrode configuration is formed such that signals in the resonator injected into the electrode configuration are not lead out of the resonator housing.

6. The resonator according to claim 1, wherein the plurality of control electrodes comprise four control electrodes.

7. The resonator according to claim 1, wherein the plurality of control electrodes are arranged equidistantly around the cavity and around the longitudinal axis of the container.

8. The resonator of claim 1, wherein the plurality of electrodes are arranged on an outer circumference of the container.

9. The resonator of claim 8, wherein the plurality of electrodes are printed onto the outer circumference.

10. The resonator of claim 1, wherein the plurality of electrodes are formed integrally in the container.

11. The resonator according to claim 10, wherein the plurality of electrodes are adjacent to or integrated into an inner wall of the container.

12. The resonator of claim 1, wherein the container is made of a dielectric material.

13. The resonator of claim 1, wherein the cavity of the container is fluidically connected with a compensation device arranged outside the resonator housing.

14. The resonator of claim 13, wherein the container extends through the resonator housing.

15. A method for manufacturing a resonator according to claim 1, the method comprising:
providing the resonator housing with the resonator space;
providing the container with the liquid crystal and the electrode configuration for generating an electric control field in order to control the permittivity of the liquid crystal;
inserting the container into the resonator housing or mounting the container to the resonator housing such that a part of the container protrudes into the resonator space so that an electrically controllable dielectric is provided in the resonator space; and
arranging the plurality of control electrodes extending along the longitudinal axis of the container around the cavity and around the longitudinal axis of the container.

16. The method of claim 15, wherein providing the container comprises providing electrodes at the container.

17. The method of claim 16, wherein providing electrodes comprises applying the electrodes onto an outer circumference of the container.

18. A filter, wherein the filter comprises:
a multitude of resonators;
wherein at least one of the multitude of resonators is a high-frequency resonator and comprises:
   a resonator housing, in which a resonator space is formed; and
   a container with a cavity, in which a liquid crystal is accommodated, wherein the container is at least partially arranged in the resonator space,
wherein the container comprises an electrode configuration for generating an electric control field to control the permittivity of the liquid crystal, and
wherein the electrode configuration comprises a plurality of control electrodes extending along a longitudinal axis of the container, the plurality of control electrodes arranged around the cavity and around the longitudinal axis of the container.

* * * * *